(12) United States Patent
Joo et al.

(10) Patent No.: US 6,689,647 B2
(45) Date of Patent: *Feb. 10, 2004

(54) METHOD FOR CRYSTALLIZING AMORPHOUS SILICON THIN-FILM FOR USE IN THIN-FILM TRANSISTORS AND THERMAL ANNEALING APPARATUS THEREFOR

(75) Inventors: Seungki Joo, Seoul (KR); Taekyung Kim, Kyungki-do (KR)

(73) Assignee: PT Plus Inc., Seoul (KR)

( * ) Notice: Subject to any disclaimer, the term of this patent is extended or adjusted under 35 U.S.C. 154(b) by 206 days.

This patent is subject to a terminal disclaimer.

(21) Appl. No.: 09/758,274

(22) Filed: Jan. 12, 2001

(65) Prior Publication Data

US 2001/0001715 A1 May 24, 2001

Related U.S. Application Data

(63) Continuation of application No. 09/174,244, filed on Oct. 16, 1998, now Pat. No. 6,197,623.

(51) Int. Cl.⁷ .................. H01L 21/20; H01L 21/48
(52) U.S. Cl. .............. 438/151; 438/156; 438/161; 438/162
(58) Field of Search ........................ 438/151, 156, 438/161, 162

(56) References Cited

U.S. PATENT DOCUMENTS

| | | | |
|---|---|---|---|
| 4,327,337 A | 4/1982 | Liu ........................ 372/3 |
| 5,025,446 A | 6/1991 | Kuizenga ............... 372/21 |
| 5,243,615 A | 9/1993 | Ortiz et al. ............ 372/34 |
| 5,322,538 A | 6/1994 | Kondo et al. .......... 65/31 |
| 5,404,366 A | 4/1995 | Wakabayashi et al. .... 372/9 |
| 5,612,967 A | 3/1997 | Lai ....................... 372/22 |
| 5,643,801 A | 7/1997 | Ishihara et al. | |
| 5,708,252 A | 1/1998 | Shinohara et al. | |
| 5,712,191 A | 1/1998 | Nakajima et al. | |
| 5,756,364 A | 5/1998 | Tanaka et al. | |
| 5,815,494 A | 9/1998 | Yamazaki et al. | |
| 5,844,149 A | 12/1998 | Akiyoshi et al. ........ 73/864.81 |
| 5,854,803 A | 12/1998 | Yamazaki et al. ........ 372/31 |
| 5,858,822 A | 1/1999 | Yamazaki et al. | |
| 5,861,337 A | 1/1999 | Zhang et al. | |
| 5,923,966 A | 7/1999 | Teramoto et al. | |
| 5,925,421 A * | 7/1999 | Yamazaki et al. ........ 427/534 |
| 5,937,282 A * | 8/1999 | Nakajima et al. ........ 438/149 |
| 6,027,960 A | 2/2000 | Kusmoto et al. | |
| 6,078,393 A | 6/2000 | Oohashi et al. ......... 356/511 |
| 6,165,876 A * | 12/2000 | Yamazaki et al. ........ 438/517 |
| 6,184,058 B1 | 2/2001 | Umemoto et al. ....... 438/73 |
| 6,197,623 B1 * | 3/2001 | Joo et al. ............... 428/156 |
| 6,455,359 B1 * | 9/2002 | Yamazaki et al. ........ 438/166 |
| 6,468,842 B2 * | 10/2002 | Yamazaki et al. ........ 438/151 |
| 6,492,659 B1 * | 12/2002 | Yamazaki et al. ........ 257/59 |

* cited by examiner

Primary Examiner—Michael S. Lebentritt
(74) Attorney, Agent, or Firm—McDermott, Will & Emery

(57) ABSTRACT

A method for crystallizing an amorphous silicon thin-film is provided, in which amorphous silicon thin-films on a large-area glass substrate for use in a TFT-LCD (TFT-Liquid Crystal Display) are crystallized uniformly and quickly by a scanning method using a linear lamp to prevent deforming of the glass substrate. The crystallization method includes the steps of forming an amorphous silicon thin-film on a glass substrate, and illuminating a linear light beam on the amorphous silicon thin-film from the upper portion of the glass substrate according to a scanning method. The crystallization method is applied to a polycrystalline silicon thin-film transistor manufacturing method including the steps of forming an amorphous silicon thin-film on a glass substrate, and crystallizing the amorphous silicon of the thin-film transistor according to a scanning method using a linear light beam. In the scanning illumination of the linear light beam, either one of a supporting member of the glass substrate and a light source is relatively moved by a scanning driver apparatus.

73 Claims, 6 Drawing Sheets

———————— PRIOR TO START OF CRYSTALLIZATION
------------------ DURING PROCEEDING OF LATERAL CRYSTALLIZATION

US 6,689,647 B2

METHOD FOR CRYSTALLIZING AMORPHOUS SILICON THIN-FILM FOR USE IN THIN-FILM TRANSISTORS AND THERMAL ANNEALING APPARATUS THEREFOR

This application is a Continuation of application Ser. No. 09/174,244 filed Oct. 16, 1998 now U.S. Pat No. 6,197,623.

BACKGROUND OF THE INVENTION

1. Field of the Invention

The present invention relates to a method for crystallizing an amorphous silicon thin-film for use in a thin-film transistor (TFT) and a thermal annealing apparatus therefor, and more particularly, to a method for crystallizing an amorphous silicon thin-film for a TFT in which amorphous silicon thin-films on a large-area glass substrate for use in a TFT-LCD (TFT-Liquid Crystal Display) are crystallized uniformly and quickly by a scanning method using a linear lamp to prevent deforming of the glass substrate, and a method for fabricating a polycrystalline TFT using the same, and a thermal annealing apparatus therefor.

2. Description of the Related Art

To enhance driving speed and resolution and improve productivity through integration of driving circuits, replacement of amorphous silicon TFT by polycrystalline silicon TFT is being vividly performed under study. Difficulties confronting when fabricating a polycrystalline silicon thin-film are to prevent a deform of glass which is used as a substrate. To do so, amorphous silicon should be crystallized within a temperature and time at which the glass substrate is resistant without being deformed.

A metal-induced lateral crystallization (MILC) method proposed to overcome the above difficulties can lower an amorphous silicon crystallization temperature at 500° C. or below and has advantages using simple equipment and processes compared with other crystallization methods. In this MILC method, a metal thin-film such as Ni, Pd and so on, is partially formed on the interface between the surface of an amorphous silicon thin-film and a substrate, and is thermally annealed at 500° C. or so, in such a manner that crystallization proceeds at the portion where the metal thin-film has been formed and in lateral direction thereof. A polycrystalline silicon TFT can be fabricated using the above MILC, in which a device having an excellent electrical characteristic can be fabricated at 500° C. or below.

FIG. 1 is a sectional view showing a manufacturing process of a TFT using the MILC method. As shown, an amorphous silicon thin-film 10 is formed in the form of an island on the whole surface of a glass substrate 100. Then, a gate insulation film 12 and a gate electrode 13 are formed in turn. Then, a metal film 14 of Ni is deposited on the whole surface of the substrate including a source region 10S and a drain region 10D and then annealed, to thereby crystallize a channel region 10C of the amorphous silicon thin-film 10 by the MILC method.

The above method has a shorter thermal processing time than that of a method for forming a gate electrode after depositing and crystallizing an amorphous silicon thin-film on the whole surface of a substrate. Since the above method crystallizes only a channel region, yield is considerably improved.

To crystallize an amorphous silicon by thermal annealing at the state where the metal thin-film is not formed requires thermal processing of about 30 hours at a temperature of 600° C. or above. Meanwhile, the above MILC technique shows a crystallization velocity of 1.6 μm/hr or more at 500□□ so, which must be very useful crystallization method. In the MILC method, when a thermal annealing temperature is 600° C. or above, the lateral crystallization proceeds more quickly depending upon the temperature. Thus, the lateral portions of the portion where the metal thin-film has been formed are crystallized all by the MILC method.

Meanwhile, in the case of a next generation large-area glass substrate, it does not facilitate to implement a furnace thermal annealing apparatus and it is difficult to enhance productivity because of a long-term thermal annealing time. For this reason, a thermal annealing apparatus adopting a number of lamps shown in FIG. 2 has been proposed.

FIG. 2 is a sectional view schematically showing a lamp thermal annealing apparatus which is used for crystallization of an amorphous silicon thin-film according to the conventional prior art. As depicted, a bottom layer oxide film 22 is formed on a substrate 21. A Ni metal layer 24 is formed on the surface of an amorphous silicon thin-film 23 formed on the oxide film 22. Then, a process for thermally processing the amorphous silicon thin-film at high temperature for a second using lamps 29 and cooling it for five seconds is performed at least once, to thereby crystallize the amorphous silicon thin-film by the MILC method.

In the MILC method, only an opaque amorphous silicon thin-film is heated and crystallized and a transparent glass substrate is not heated by the lamps, to accordingly prevent a deformation of the glass substrate. The reason for cooling the amorphous silicon for five seconds or so is to block the heats of the heated amorphous silicon from being transferred to the glass substrate, in order to prevent deforming of the glass substrate due to the heats transferred from the amorphous silicon to the glass substrate.

However, the above method for heating the whole surface of the substrate is also limited to implement a thermal annealing apparatus for uniformly heating a large-area glass substrate, such as a substrate of 600 mm×500 mm or larger. As described above, if all the portions of the substrate are not uniformly heated, a thermal processing time should be longer in order to crystallize all the portions of the substrate. Thus, the temperature of the amorphous silicon may be locally raised, so that the substrate may be deformed.

SUMMARY OF THE INVENTION

To solve the above problems, it is an object of the present invention to provide an amorphous silicon crystallization method capable of crystallizing an amorphous silicon without deforming a large-area transparent glass substrate irrespective of the size of the substrate, employing a continuous process rapid thermal annealing (RTA) method using light.

It is another object of the present invention to provide a method for manufacturing a low-temperature polycrystalline silicon thin-film transistor capable of greatly improving a crystallization uniformity and a crystallization velocity by employing both a continuous process rapid thermal annealing (RTA) method and a metal-induced lateral crystallization (MILC) method simultaneously.

It is still another object of the present invention to provide a thermal annealing apparatus which is used for crystallization of an amorphous silicon thin-film for use in a thin-film transistor (TFT), capable of preventing deformation of a glass substrate, in which an amorphous silicon thin-film is uniformly and rapidly crystallized on a large-are glass substrate for use in a thin-film transistor-liquid crystal display (TFT-LCD) by a continuous process or scanning method using a linear lamp.

To accomplish the above object of the present invention, according to one aspect of the present invention, there is provided a thermal annealing apparatus for crystallizing an amorphous silicon thin-film, the thermal annealing apparatus comprising: supporting means for supporting at least one glass substrate on which the amorphous silicon thin-film has been formed; a light source for illuminating a linear light beam to be focused on the glass substrate from the upper portion of the glass substrate; and scanning driver means for relatively moving one of the supporting means and the light source so that the linear light beam can be illuminated on the silicon thin-film according to a scanning method.

According to another aspect of the present invention, there is also provided an amorphous silicon thin-film crystallization method comprising the steps of: forming an amorphous silicon thin-film on a glass substrate; and illuminating a linear light beam on the amorphous silicon thin-film from the upper portion of the glass substrate according to a scanning method.

Also, a method for manufacturing a polycrystalline silicon thin-film transistor employing the above crystallization method, comprising the steps of: forming an amorphous silicon thin-film on a glass substrate; and crystallizing the amorphous silicon of the thin-film transistor according to a scanning method using a linear light beam.

Here, the step of forming the amorphous silicon thin-film transistor comprises the sub-steps of: forming an active layer composed of the amorphous silicon on the glass substrate; forming a gate insulation film and a gate electrode on the active layer in turn; and depositing a metal thin-film on the resultant glass substrate, wherein the amorphous silicon with respect to a channel region positioned in the lower portion of the gate insulation film is crystallized by a metal-induced lateral crystallization (MILC) method using the metal thin-film.

As described above, the thermal annealing apparatus according to the present invention can locally heat the amorphous silicon to be crystallized by a scanning method where the substrate is transported at the state where the linearly focused light of the lamp is illuminated on the glass substrate. As a result, the amorphous silicon can be crystallized without deforming a large-are transparent glass substrate such as a LCD for a TV irrespective of the size of the substrate and without expanding the size of the thermal annealing apparatus on a three-dimensional basis.

BRIEF DESCRIPTION OF THE DRAWINGS

The objects and other advantages of the present invention will become more apparent by describing in detail the structures and operations of the present invention with reference to the accompanying drawings, in which.

DETAILED DESCRIPTION OF THE INVENTION

Figure 3:
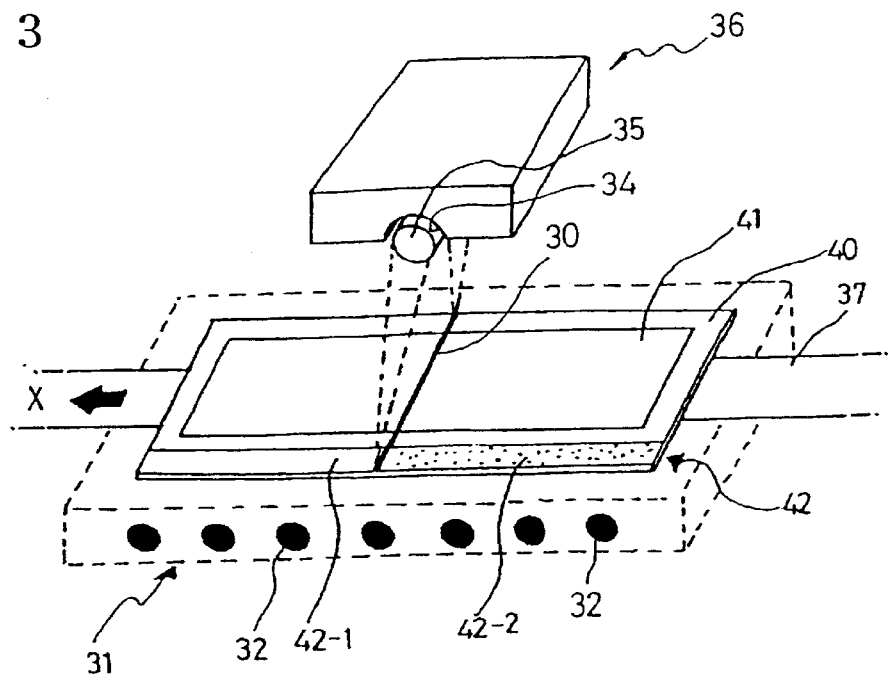
FIG. 3 is a perspective view showing a thermal annealing apparatus for crystallizing an amorphous silicon thin-film according to the present invention.

A preferred embodiment of the present invention will be described in detail with reference to the accompanying drawings. Referring to FIG. 3, a thermal annealing apparatus according to the present invention includes a halogen linear lamp 35 functioning as a light source 36 for illuminating a light beam 30 focused in linear form on a TFT array 41 formed on a glass substrate 40 and an elliptical reflective mirror 34 for focusing the light illuminated from the lamp 35 in linear form on the glass substrate 40. A lower heating portion 31 including a number of halogen preheating lamps 32 is fixedly installed in the lower portion of the light source 36. A conveyer belt 37 is mounted on the lower heating portion 31, which functions as a transportation unit for transporting a number of glass substrates 40 continuously. The conveyer belt 37 supports the substrate 40 and simultaneously moves the substrate in one direction continuously.

Figure 4:
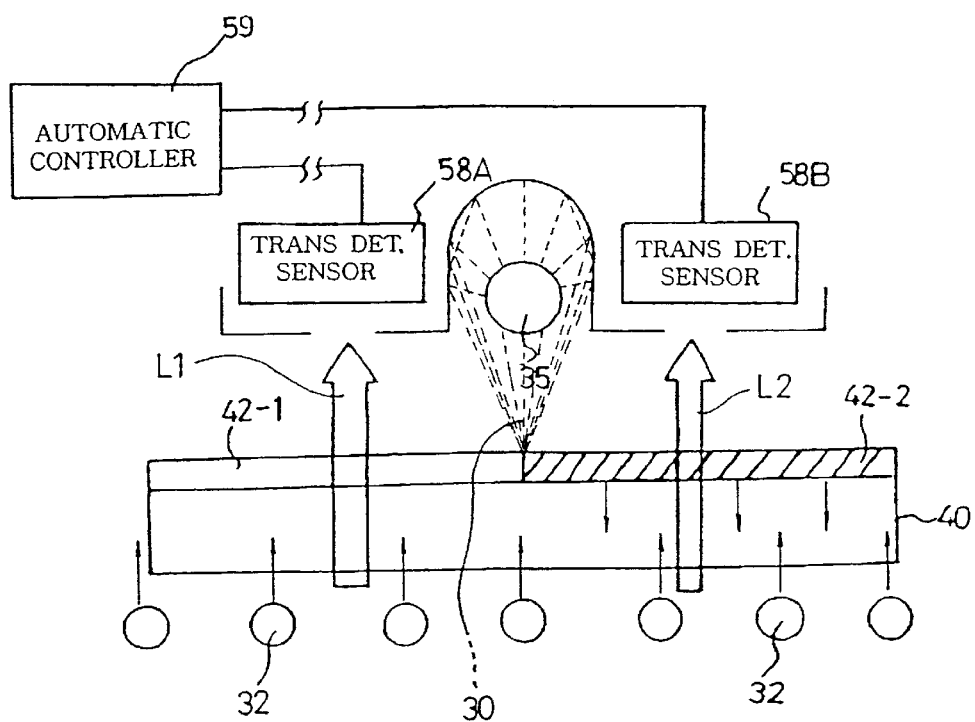
FIG. 4 is a schematic sectional view showing an automatic control apparatus for controlling a transportation velocity of the substrate in the FIG. 3 thermal annealing apparatus.

The thermal source, that is, the light source 36 is combined with an automatic control apparatus shown in FIG. 4, to thereby configure a continuous and uniform heating apparatus. In this case, as the conveyer belt 37 enables the substrate 40 to move continuously in the arrow mark direction X, the thermal source 36 scans the substrate 40 and performs crystallization of the substrate 40 without excessively heating the substrate 40. In this case, the thermal source 36 also moves continuously by a predetermined distance in the direction opposite to the arrow mark, to thereby scan the substrate.

Meanwhile, as shown in FIG. 4, a pair of transmittivity detection sensors 58A and 58B for detecting transmittivity of the light are installed at the back and forth of the thermal source 36. The transmittivity data of each portion obtained from the pair of the transmittivity detection sensors 58A and 58B is supplied to an automatic controller 59 for controlling the power of the lamp 35 and the transportation velocity of the conveyer belt 37 using the transmittivity data.

The operation of the thermal annealing apparatus according to the present invention will be described below in more detail with reference to FIGS. 3 and 4.

A TFT array 41 including an amorphous silicon to be crystallized is formed on the glass substrate 40 which is put on the conveyer belt 37 and transported toward the thermal annealing apparatus. A detection pattern 42 composed of an amorphous silicon of an elongate strip pattern, for monitoring crystallization of the amorphous silicon is formed in one side of the glass substrate 40 along the transportation direction of the substrate.

The lower heating portion 31 plays a role of preheating the substrate in advance up to a temperature, e. g. 400° C. or below in which crystallization of the amorphous silicon does not occur, in order to shorten a thermal annealing time of the glass substrate 40. The light beam 30 generated from the linear lamp 35 of the thermal source 36 is linearly focused by a reflective mirror 34 whose inner circumferential portion is elliptical and which is formed in lengthy direction to cover the lamp 35 and illuminated on the glass substrate 40. In this state, if the conveyer belt 37 is driven in the arrow direction X, the glass substrate 40 continuously moves and is subject to a scanning illumination by the linear light beam 30.

Thus, it is possible to perform a rapid heating of 80° C./sec or more by adjusting a scanning condition of the lamp 35. Here, only a heating effect due to conduction of the light beam becomes a single heating source with respect to the substrate, since cooling air is supplied to the substrate continuously. Accordingly, the transparent glass substrate 40 is not, on the one hand, heated by the light illuminated from the lamp 35 or the lower preheating lamps 32. On the other hand, the amorphous silicon thin-film of the TFT array 41 formed on the glass substrate 40 absorbs the energy corresponding to the wavelength of the light beam 30 illuminated from the lamp 35 and heated locally.

Meanwhile, at least one lamp 35 can be configured. The array of the lamps 35 can be adjusted according to the area of the substrate and the processing conditions in order to obtain a uniform temperature slope.

In the thermal annealing process using the light, the glass substrate 40 transmits the light and so is not heated. Thus, only the amorphous silicon absorbs the light to be heated. Here, since the amorphous silicon is transformed into a crystalline silicon which is transparent, a self-stop process for stop a further heating is possible.

Referring to FIGS. 3 and 4, the detection pattern 42 is also comprised of an amorphous silicon. Accordingly, the amorphous silicon of the TFT array 41 is transformed into a crystalline silicon and becomes transparent through a crystallization process of the amorphous silicon. A reference numeral 42-1 denotes a portion in which the amorphous silicon is changed into a crystalline silicon by illumination of the light beam of the lamp 35 and which has become transparent. A reference numeral 42-2 is a portion of the opaque amorphous silicon which has not been illuminated yet from the lamp 35.

During crystallization of the detection pattern 42 due to illumination of the light beam 30 from the lamp 35, the preheating lamps 32 in the lower heating portion 31 also illuminate the light on the substrate 40 to supply an appropriate amount of heat thereto. The light transmits through the detection patterns 42-1 and 42-2 to then reach the transmittivity detection sensors 58A and 58B. Here, the light L1 transmitting through the transparent detection pattern 42-1 and the light L2 whose part is reflected from the detection pattern 42-2 and other part is transmitted through the opaque detection pattern 42-2 are detected as a respective different value by the transmittivity detection sensors 58A and 58B according to the difference of the amount of the transmitted light.

Then, the automatic controller 59 compares the transmittivity values read from each portion of the detection patterns 42-1 and 42-2 by the transmittivity detection sensors 58A and 58B with a reference value and judges a thermal annealing state according to the comparison result, to thereby automatically control the operation of each component of the thermal annealing apparatus. That is, the power of the lamps 35 and 32, the transportation velocity of the conveyer belt 37 or the transportation velocity of the upper thermal source 36 are automatically controlled according to the transmittivity values obtained from the detection sensors 58A and 58B. Thus, the real-time measurement results in the detection sensors 58A and 58B are fed back to the automatic controller 59, when the silicon crystallization are not formed uniformly on the glass substrate 40 during the thermal annealing or the uniformity between the processes is changed. As a result, a relative scanning velocity between the glass substrate 40 and the thermal source 36 and a process variable such as a lamp power can be adjusted.

As the amorphous silicon thin-film is crystallized, transparency is changed. Thus, if crystallization of the amorphous silicon thin-film is measured while thermally annealing the large-area glass substrate 40 one by one, a process condition can be adjusted in real time. As a result, the present invention can greatly enhance a crystallization uniformity compared with a conventional furnace thermal annealing method which thermally annealing a number of large-area glass substrates all at a time.

The conventional furnace thermal annealing apparatus has a technical limitation since the size of the furnace becomes larger on a three-dimensional basis as the area of the substrate becomes larger. However, the present invention can solve the above problem by constructing a two-dimensional expanded heating apparatus, that is, lengthening the linear lamp, in order to heat the large-area glass substrate 40. In this case, a scanning apparatus, that is, the conveyer belt 37 or a thermal source scanning apparatus (not shown) is enough if a one-dimensional uniformity of the light beam illuminated on the glass substrate is maintained although a substrate area increases. Thus, the thermal annealing apparatus of the present invention is very advantageous compared with the conventional thermal annealing apparatus requiring the two-dimensional uniform temperature. The above advantages are preferably applied to manufacturing of a large-area flat display such as a liquid crystal display (LCD) which is used for a notebook or desktop computer or a large-sized TV.

Meanwhile, crystallization of the amorphous silicon at high temperatures requires a sufficient incubation time. If a thermal process employing a lamp is used for a MILC, crystallization starts from at a portion where a metal layer is formed and proceeds in lateral direction before it reaches an incubation time necessary for crystallization of a portion where the metal layer is not formed. Here, at least one lamp 35 can be used in order to enhance a crystallization velocity as described above.

Referring to FIGS. 5A through 5D, a change of the temperature slopes of the amorphous silicon thin-film are described according to a thermal annealing time during thermal annealing using the lamp, in the cases that a capping oxide layer exists or not on the whole surface of a test piece where devices are formed on the glass substrate.

Figure 5A:
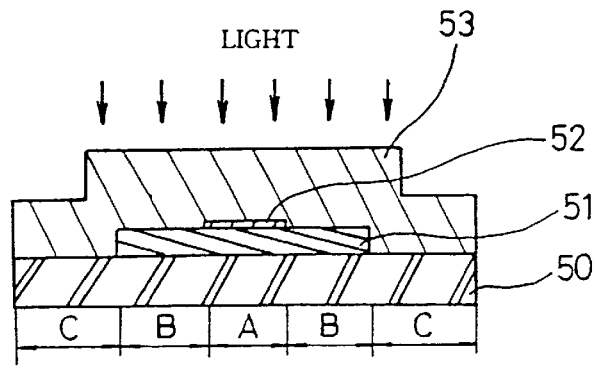
FIG. 5A is a sectional view of a test piece to be thermally annealed.
Figure 5B:
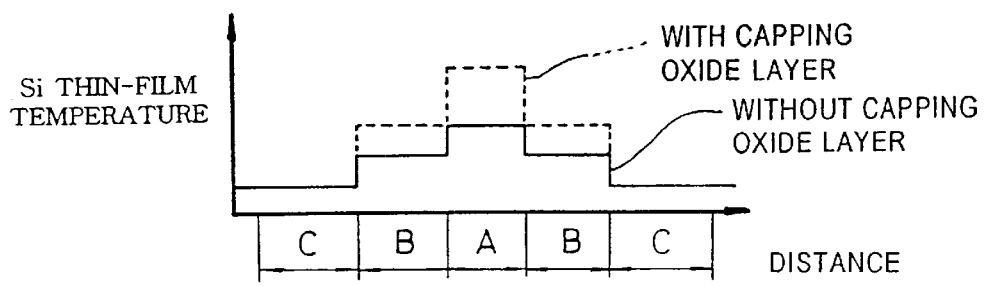
FIG. 5B is a graphical view showing the temperature slopes of a silicon thin-film at the thermal annealing start step in the cases that a capping oxide film exists or not, respectively.
Figure 5C:
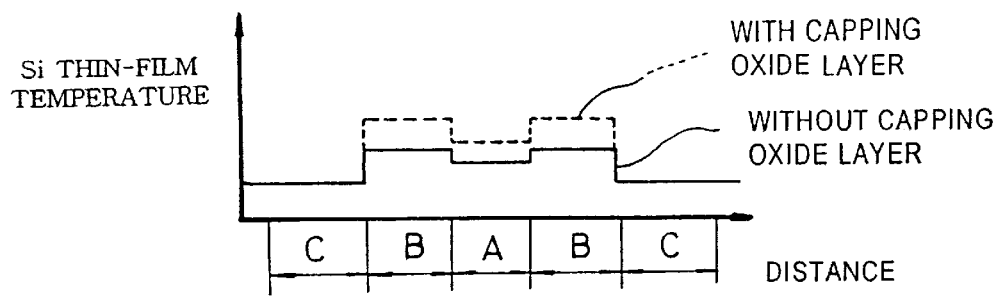
FIG. 5C is a graphical view showing the temperature slopes of a silicon thin-film when a metal-induced crystallization (MIC) proceeds at the thermal annealing intermediate step in the cases that a capping oxide film is formed or not, respectively.
Figure 5D:
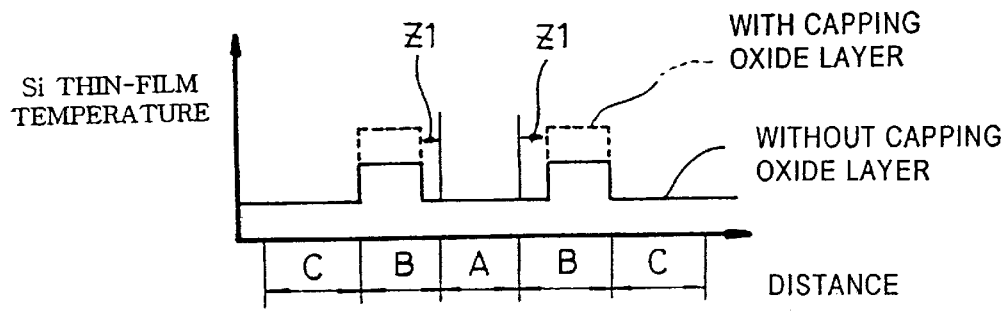
FIG. 5D is a graphical view showing the temperature slopes of a silicon thin-film when a metal-induced lateral crystallization (MILC) proceeds at the thermal annealing intermediate step in the cases that a capping oxide film is formed or not, respectively.

FIG. 5A is a sectional view of a test piece to be thermally annealed. FIG. 5B is a graphical view showing the temperature slopes of a silicon thin-film at the thermal annealing start step in the cases that a capping oxide film exists or not, respectively. FIG. 5C is a graphical view showing the temperature slopes of a silicon thin-film when a metal-induced crystallization (MIC) proceeds at the thermal annealing intermediate step in the cases that a capping oxide film is formed or not, respectively. FIG. 5D is a graphical view showing the temperature slopes of a silicon thin-film when a metal-induced lateral crystallization (MILC) proceeds at the thermal annealing intermediate step in the cases that a capping oxide film is formed or not, respectively.

Referring to FIGS. 5B through 5D, a dotted line indicates the temperature of the silicon region where a capping oxide layer 53 composed of SiO2 is deposited on the surface of the transparent glass substrate 50 to be thermally processed. The transparent oxide layer 53 has an effect increasing the temperature of the amorphous silicon thin-film 51. As such, the thermal processing of the present invention can form a capping oxide layer 53 covering the upper portion of the amorphous silicon thin-film 51 in order to enhance the efficiency of the RTA due to the lamp heating. Since the capping oxide layer 53 is transparent, it plays a role of a thermal protection layer for assisting the light absorption and suppressing the thermal discharging, to thereby increase a temperature rise effect of only an amorphous silicon.

The capping oxide layer 53 is also 1/100 the thermal conduction compared with a silicon, which transmits the light of the lamp toward the amorphous silicon thin-film 51 and prevents the locally heated silicon thin-film from directly contacting the atmosphere and so being cooled. Thus, the large-area transparent glass substrate 50 does not reach a transformation temperature and only an amorphous silicon thin-film 51 which has been patterned on the substrate 50 is heated up to a temperature necessary for the metal-induced crystallization.

Referring to FIG. 5A, the test piece has a structure in which an opaque amorphous silicon thin-film 51 is patterned in the form of an island on the transparent glass substrate 50, an opaque metal thin-film 52 having a thickness of 5 Å through 50 Å is partially deposited on the upper portion of the amorphous silicon thin-film 51, and a transparent capping oxide layer 53 of a thickness of about 3000 Å is deposited on the whole surface of the test piece.

Here, the metal thin-film 52 deposited on the upper portion of the amorphous silicon thin-film 51 acts as a catalyst for lowering the temperature of crystallization of the amorphous silicon thin-film 51. The metal thin-film 52 is formed by depositing a metal material such as Ni, Fe, Co, Ru, Rh, Pd, Os, Ir, Pt, Sc, Ti, V, Cr, Mn, Cu, Zn, Au and Ag or an alloy thereof on the amorphous silicon thin-film 51.

FIG. 5B shows the temperature slopes of a silicon thin-film at the time when a thermal annealing starts with respect to a test piece. As indicated, a silicon region A where an opaque amorphous silicon thin-film 51 and a metal thin-film 52 are deposited absorbs a more amount of light relatively than a transparent substrate region and an amorphous silicon region B where the metal thin-film 52 is not deposited, and is heated at higher temperatures. Here, the temperature as indicated in dotted lines in the case that the capping oxide layer 53 has been formed is relatively higher than that as indicated in solid lines in the case that the capping oxide layer does not exist.

FIG. 5C shows the temperature slopes of a silicon thin-film at the thermal annealing intermediate step, in which a metal-induced crystallization (MIC) proceeds in lateral direction of the metal thin-film 52. As a result, an amorphous silicon region A positioned in the lower portion of the metal thin-film is changed rapidly into a transparent crystalline silicon by a metal-induced crystallization (MIC), in such a manner that a light absorption decreases and a temperature falls. Thus, a heat transfer to the substrate is decreased, to thereby decrease the possibility of deformation of the substrate.

FIG. 5D shows the temperature slopes of a silicon thin-film at the time when a metal-induced lateral crystallization (MILC) proceeds from an amorphous silicon region A positioned in the lower portion of the metal thin-film 52 where crystallization has been completed according to the continuous thermal annealing to an amorphous silicon region B positioned in the lateral portion of the amorphous silicon region A. The portion where crystallization has been completed is changed into a transparent crystalline silicon. Accordingly, since a light absorption decreases and a temperature falls, it can be seen that the temperature of the glass substrate 50 is decreased as crystallization of the amorphous silicon proceeds. In FIG. 5D, an arrow mark Z1 indicates a direction in which the MILC proceeds.

Figure 8:
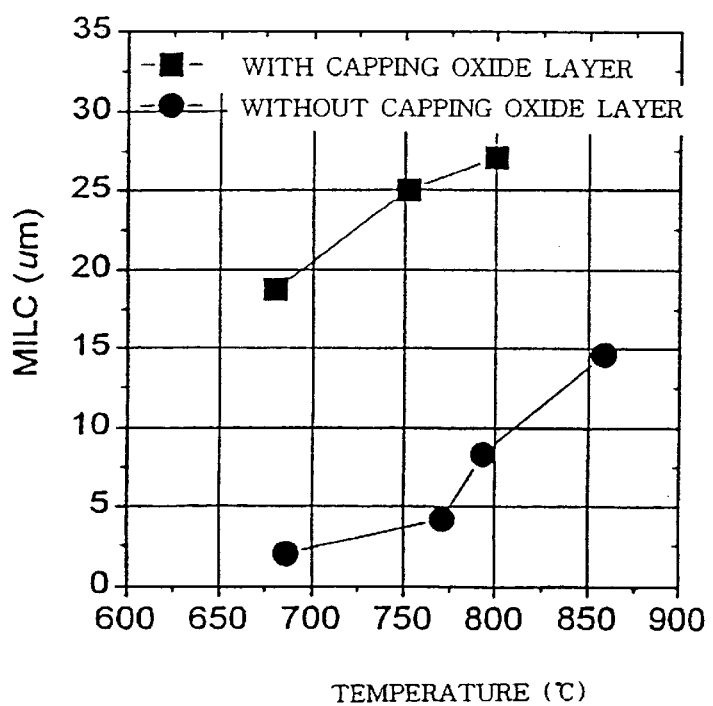
FIG. 8 is a graphical view showing the MILC distances at a maximum thermal annealing temperature in the cases that a capping oxide film is formed and not, respectively.

FIG. 8 is a graphical view showing the MILC distances at a maximum thermal annealing temperature in the cases that a capping oxide film is formed and not, respectively, in which a scanning is accomplished at a velocity of 1 mm/sec or so.

As shown in FIG. 8, a test piece where a capping oxide layer is formed has about five times the crystallization velocity as that where the capping oxide layer does not exist, which indicates that a temperature rise effect is obtained by existence of the capping oxide layer.

Figure 6:
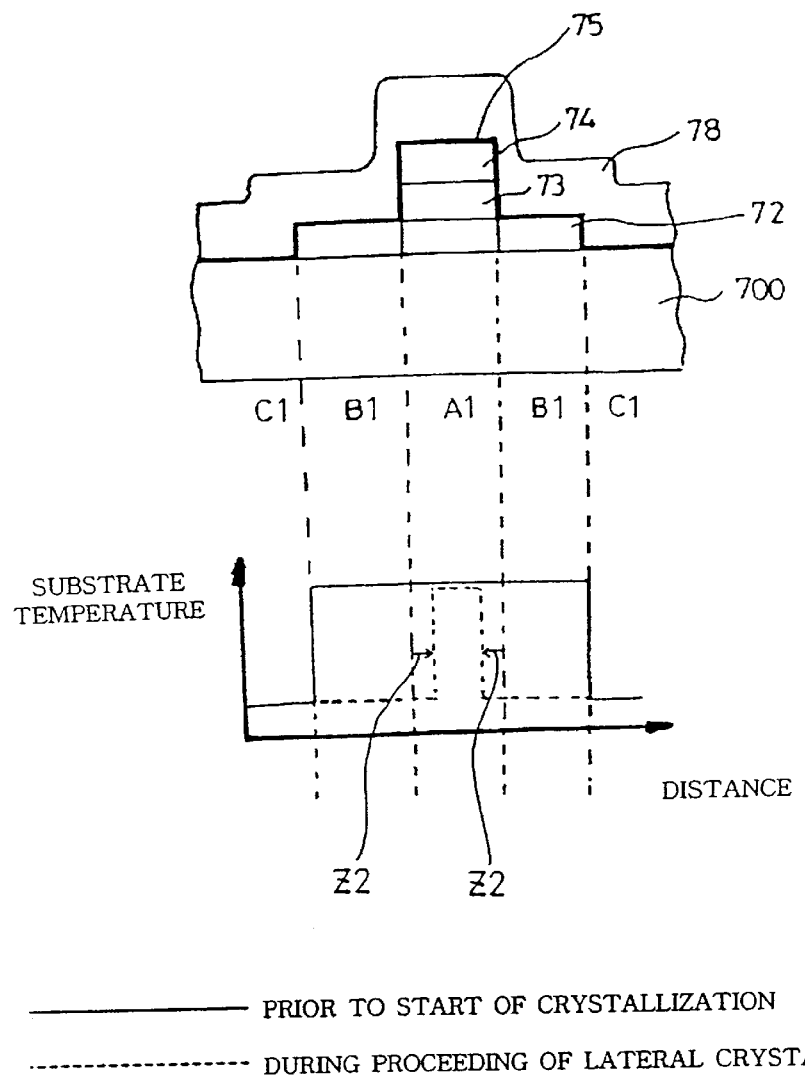
FIG. 6 is a sectional view of the substrate for explaining the temperature distribution of the substrate and a graphical view of a corresponding temperature distribution when an amorphous silicon thin-film for a TFT according to the present invention is crystallized.

FIG. 6 is a sectional view of the substrate and a graphical view of a corresponding temperature slope when crystallizing an amorphous silicon thin-film for a TFT according to the present invention.

In the case of the TFT, an amorphous silicon thin-film 72 is formed and patterned on a glass substrate 700 and then a gate insulation film 73 and a gate electrode 74 are formed thereon. Thereafter, a metal thin-film 75, e. g. a Ni thin-film is deposited in the thickness of 5 Å or more on the whole surface of the glass substrate 700. The metal thin-film 75 is automatically aligned only in a source and drain region B1 except for a channel region A1 and discriminatively formed.

In this case, a metal which can be used as a metal thin-film is a metal material such as Fe, Co, Ru, Rh, Pd, Os, Ir, Pt, Sc, Ti, V, Cr, Mn, Cu, Zn, Au and Ag except for Ni or an alloy thereof.

Sequentially, a thermal annealing is performed using a thermal annealing apparatus according to the present invention, in which the amorphous silicon thin-film 72 is crystallized by the MIC and MILC methods. In this way, since the gate electrode 74 is opaque in the case that the substrate 700 on which the gate electrode 74 has been formed is thermally annealed, heating is further easily performed by a lamp, to expediate a MILC method.

That is, at the initial time, of the thermal annealing operation, the amorphous silicon region B1 (e. g. source and drain regions) covered with the metal thin-film 75 and the amorphous silicon region A1 (e. g. a channel region) covered with the opaque gate electrode 74 absorb more light than a transparent substrate region C1 and are heated at high temperatures as shown as a solid line. Thereafter, the MIC proceeds and the amorphous silicon region B1 positioned in the lower portion of the metal thin-film 75 is changed into a transparent crystalline silicon. As a result, a light absorption rate is decreased, to thereby cause the temperature to fall down. The MILC also proceeds from the amorphous silicon region B1 which has been crystallized in the lower portion of the metal toward the amorphous silicon region A1 located on the lateral portion of the amorphous silicon region B1. The portion in which crystallization has proceeded is changed into a transparent crystalline silicon. Accordingly, a light absorption rate is decreased, to thereby cause the temperature to fall down. In the drawing, an arrow mark Z2 indicates a direction toward which lateral crystallization proceeds.

Figure 7:
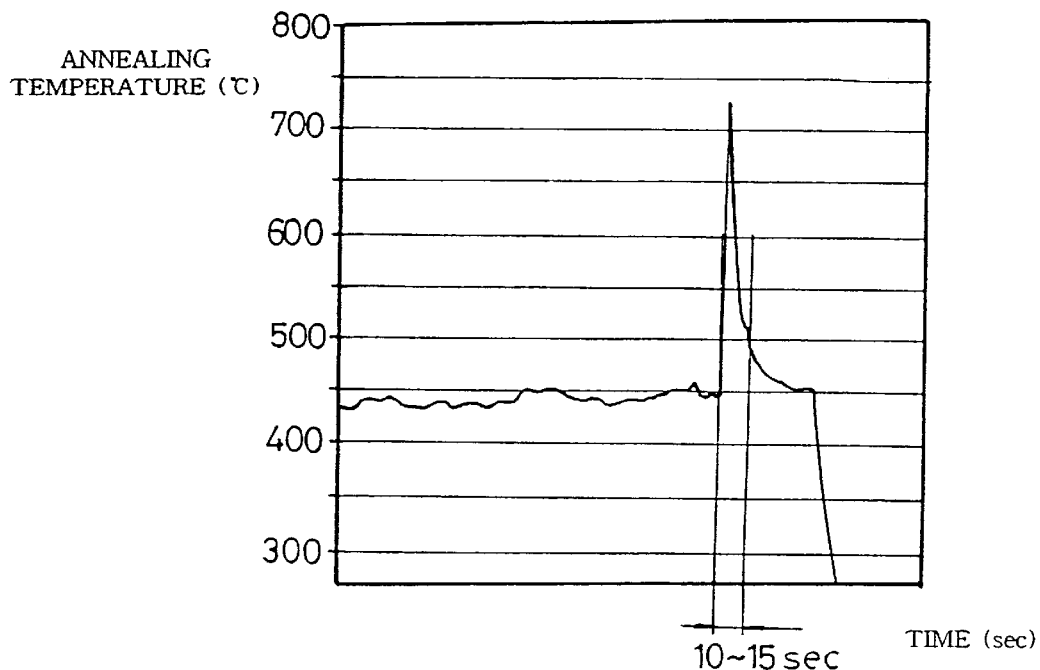
FIG. 7 is a graphical view illustrating the temperature change according to a time when a thermal annealing is performed according to a scanning method of the present invention.

FIG. 7 is a graphical view illustrating the temperature change of the substrate according to a time when a thermal annealing is performed according to a scanning method of the present invention. As shown, in the case of a substrate which has been preheated at 400° C. or so by a preheating lamp, an abrupt temperature rise occurs for several seconds, for example, ten to fifteen seconds when a lamp scans over the substrate. By doing so, it can be seen that crystallization is completed and then cooling is performed.

Thus, deformation of the glass substrate is minimized and a process condition appropriate for a large-area continuous process is obtained, by properly adjusting a scanning velocity and a lamp power.

Figure 1:
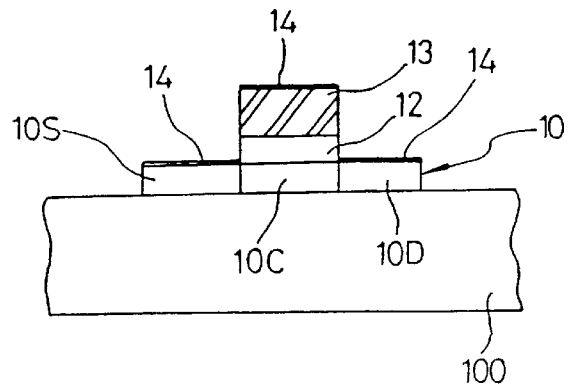
FIG. 1 is a sectional view showing a TFT in order to explain a MILC method.
Figure 2:
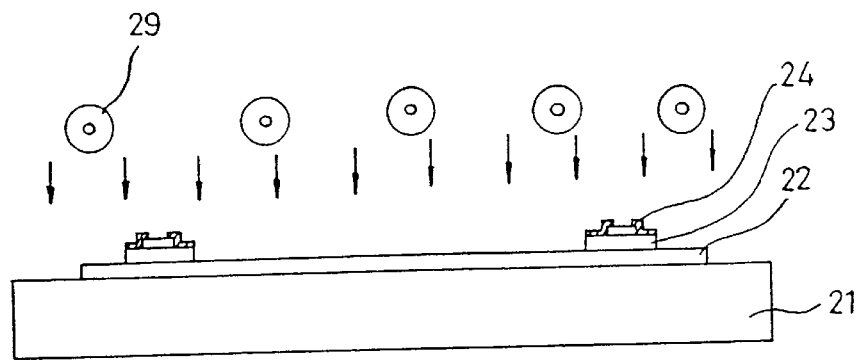
FIG. 2 is a sectional view schematically showing a thermal annealing apparatus which is used for transforming an amorphous silicon into a polycrystalline silicon according to the conventional prior art.
Figure 9:
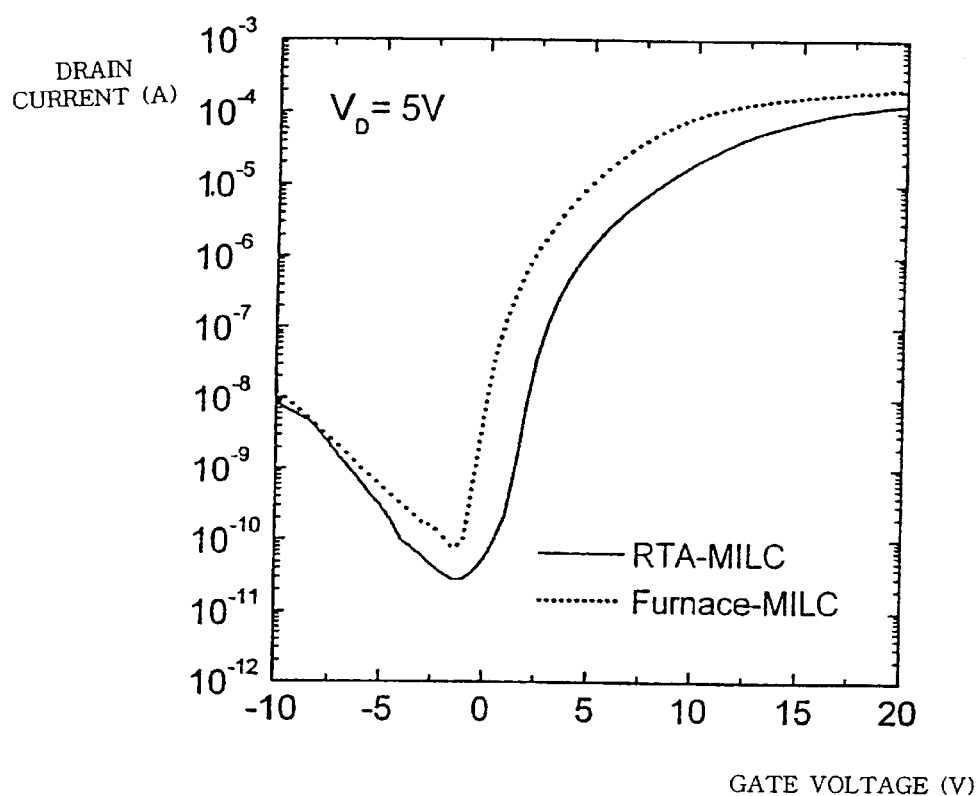
FIG. 9 is a graphical view showing the transfer characteristics of the polycrystalline silicon TFTs fabricated by he conventional art and the present invention, respectively.

FIG. 9 is a graphical view showing the transfer characteristics of the polycrystalline silicon TFTs fabricated by he conventional art and the present invention, respectively. The characteristics of the present invention and the prior art are measured using a transistor having the structure shown in FIG. 1. In the present invention, crystallization with respect to an amorphous silicon thin-film proceeds according to a linear RTA-MILC method. In the prior art, crystallization proceeds according to a furnace MILC method using a furnace thermal annealing apparatus. In this case, when a transistor is thermally annealed according to the present invention, a scanning velocity is 1 mm/sec, a preheating temperature of the substrate is 400° C., and the temperature of a heating line is 700° C. After crystallization has proceeded according to the present invention and the prior art, the characteristics with respect to the TFTs obtained via a general successive process are investigated. First, a drain current [A] is measured according to the change of the gate voltage with respect to the TFT whose drain voltage VD is 5V and width/length (W/L) is 10/8 and the thus-obtained transfer characteristic is shown in the graph of FIG. 9.

Meanwhile, a threshold voltage [V], a sub-threshold slope [mV/dec], a field-effect mobility [cm$^2$/V·s], and a maximum on/off current ratio are shown in the following Table 1.

TABLE 1

| Item | Furnace-MILC | RTA-MILC |
|---|---|---|
| Threshold voltage [V] | 1 | 2.5 |
| Sub-threshold slope [mV/dec] | 467 | 588 |
| Field-effect mobility [cm$^2$/V · s] | 120 | 150 |
| Maximum on/off current ratio | 2.8E6 | 4.5E6 |

As can be seen from FIG. 9 and Table 1, the physical characteristics of the transistor fabricated by crystallizing an amorphous silicon according to the present invention are substantially same as those of a conventional polycrystalline silicon transistor. However, in the case of the on/of current ratio and the field-effect mobility, it can be seen that the values of the transistor according to the present invention are greatly enhanced.

As described above, the thermal annealing apparatus according to the present invention can locally heat an amorphous silicon to be crystallized according to a scanning method where a substrate is transferred at the state where linearly focused lamp light is illuminated on a glass substrate. Accordingly, the present invention can crystallize an amorphous silicon uniformly without deformation of a large-area transparent glass substrate such as a LCD for TV irrespective of the size of the substrate and without extending the size of the thermal annealing apparatus three-dimensionally.

Further, in the case where a number of lamps are installed, an amorphous silicon thin-film can be crystallized at a number of positions, to thereby enhance a crystallization velocity. Since crystallization with respect to an amorphous silicon is controlled individually and in real-time by an automatic control apparatus including a transmittivity detection sensor, the quality of the thermally annealed products can be uniformly maintained, to thereby greatly enhance a yield of large-area LCD products.

In addition, the method for crystallizing an amorphous silicon thin-film according to the present invention can locally illuminate linear light on the thin-film using the thermal annealing apparatus, to thereby crystallize the amorphous silicon thin-film uniformly and prevent the substrate from being deformed. Also, in the case that a capping oxide layer, a crystallization velocity can be enhanced. Further, in the case that the present invention is applied to manufacturing of a polycrystalline silicon transistor, a device having excellent physical characteristics can be fabricated without deform of the substrate.

As described above, the present invention has been shown and described with respect to a preferred embodiment as a particular example. The present invention is, however, not limited to the above embodiment, and there are many variations and modifications by a person skilled in the art without departing from the scope and spirit of the present invention.

What is claimed is:

1. An amorphous silicon film crystallization method comprising the steps of:
    forming an amorphous silicon film on an insulation substrate;
    forming at least one metal-containing material on at least a part of the amorphous silicon film; and
    illuminating linear light radiated from at least a lamp, using a focusing unit, on the amorphous silicon film formed on the insulation substrate according to a spanning method.

2. The crystallization method according to claim 1, wherein said step of forming the metal-containing material is performed by one of a deposition method, an ion implantation method, and a solution coating method.

3. The crystallization method according to claim 1, wherein said linear light is illuminated from the upper portion, the lower portion or both the upper and lower portions of the amorphous silicon film.

4. The crystallization method according to claim 1, wherein said linear light is simultaneously illuminated on at least one portion of the amorphous silicon film.

5. The crystallization method according to claim 1, wherein said metal is comprised of one selected from a group composed of Ni, Fe, Co, Ru, Rh, Pd, Os, Ir, Pt, Sc, Ti, V, Cr, Mn, Cu, Zn, Au and Ag or an alloy thereof.

6. The crystallization method according to claim 1, wherein said amorphous film is crystallized by MIC (metal-induced crystallization).

7. The crystallization method according to claim 1, wherein said amorphous film is crystallized by MILC (metal-induced lateral crystallization).

8. The crystallization method according to claim 1, further comprising the step of forming a capping insulation film on said amorphous film.

9. The crystallization method according to claim 8, wherein said capping insulation film is an oxide film or a nitride film.

10. The crystallization method according to claim 8, wherein said capping insulation film is formed after forming said metal-containing material.

11. The crystallization method according to claim 8, wherein said capping insulation film is formed prior to forming said metal-containing material, and then said metal-containing material is formed after patterning at least a part of said capping insulation film.

12. An amorphous silicon film crystallization method comprising the steps of:
forming an amorphous silicon film on an insulation substrate; forming a capping insulation film on said amorphous film; and
illuminating linear light radiated from at least a lamp, using focusing unit, on the amorphous silicon film formed on the insulation substrate according to a scanning method.

13. The crystallization method according claim 12, wherein said linear light is illuminated from the upper portion, the lower portion or both the upper and lower portions of the amorphous silicon film.

14. The crystallization method according to claim 12, wherein said linear light is simultaneously illuminated on at least one portion of the amorphous silicon film.

15. The crystallization method according to claim 12, wherein said capping insulation film is an oxide film or a nitride film.

16. A method for manufacturing a polycrystalline silicon thin-film transistor comprising the steps of:
forming an active layer composed of an amorphous silicon film on an insulation substrate;
forming an amorphous silicon thin-film transistor by forming a gate insulation film and a gate electrode;
forming at least one metal-containing material on at least a part of the amorphous silicon thin-film transistor; and
crystallizing the amorphous silicon film of the thin-film transistor by illuminating linear light radiated from at least a lamp on the amorphous silicon film formed on the insulation substrate according to a scanning method.

17. The method according to claim 16, wherein said step of forming the metal-containing material is performed by one of a deposition method, an ion implantation method, and a solution coating method.

18. The method according to claim 16, wherein said linear light is illuminated from the upper portion, the lower portion or both the upper and lower portions of the amorphous silicon film.

19. The method according to claim 16, wherein said linear light is simultaneously illuminated on at least one portion of the amorphous silicon film.

20. The method according to claim 16, wherein said metal is comprised of one selected from a group composed of Ni, Fe, Co, Ru, Rh, Pd, Os, Ir, Pt, Sc, Ti, V, Cr, Mn, Cu, Zn, Au and Ag or an alloy thereof.

21. The method according to claim 16, wherein said amorphous film is crystallized by MIC (metal-induced crystallization).

22. The method according to claim 16, wherein said amorphous film is crystallized by MILC (metal-induced lateral crystallization).

23. The method according to claim 16, further comprising the step of forming a capping insulation film on said amorphous film.

24. The method according to claim 23, wherein said capping insulation film is an oxide film or a nitride film.

25. The method according to claim 23, wherein said capping insulation film is formed after forming said metal-containing material.

26. The method according to claim 23, wherein said capping insulation film is formed prior to forming said metal-containing material, and then said metal-containing material is formed after patterning at least a part of said capping insulation film.

27. A method for manufacturing a polycrystalline silicon film transistor comprising the steps of:
forming an active layer composed of an amorphous silicon on an insulation substrate;
forming an amorphous silicon thin-film transistor by forming a gate insulation film and a gate electrode;
forming a capping insulation film on the amorphous silicon thin-film transistor; and
crystallizing the amorphous silicon film of the thin-film transistor by illuminating linear light radiated from at least a lamp on the amorphous silicon thin-film formed on the insulation substrate according to a scanning method.

28. The method according to claim 27, wherein said linear light is illuminated from the upper portion, the lower portion or both the upper and lower portions of the amorphous silicon film.

29. The method according to claim 27, wherein said linear light is simultaneously illuminated on at least one portion of the amorphous silicon film.

30. The method according to claim 27, wherein said capping insulation film is an oxide film or a nitride film.

31. A method for manufacturing a polycrystalline silicon thin-film to obtain a crystalline silicon film comprising the steps of:
forming an amorphous silicon film on an insulation substrate;
forming at least one metal-containing material on at least a part of the amorphous silicon film;
crystallizing the amorphous silicon film; and
illuminating linear light radiated from at least a lamp, using a focusing unit, on the crystalline silicon film formed on the insulation substrate according to a scanning method.

32. The method according to claim 31, wherein said step of forming the metal-containing material is performed by one of a deposition method, an ion implantation method, and a solution coating method.

33. The method according to claim 31, wherein said linear light is illuminated from the upper portion, the lower portion or both the upper and lower portions of the crystalline silicon film.

34. The method according to claim 31, wherein said linear light is simultaneously illuminated on at least one portion of the crystalline silicon film.

35. The method according to claim 31, wherein said metal-containing material is comprised of one selected from a group composed of Ni, Fe, Co, Ru, Rh, Pd, Os, Ir, Pt, Sc, Ti, V, Cr, Mn, Cu, Zn, Au and Ag or an alloy thereof.

36. The method according to claim 31, wherein said amorphous film is crystallized by MIC (metal-induced crystallization).

37. The method according to claim 31, wherein said amorphous film is crystallized by MILC (metal-induced lateral crystallization).

38. The method according to claim 31, further comprising the step of forming a capping insulation film on said amorphous film.

39. The method according to claim 38, wherein said capping insulation film is an oxide film or a nitride film.

40. The method according to claim 38, wherein said capping insulation film is formed after forming said metal-containing material.

41. The method according to claim 38, wherein said capping insulation film is formed prior to forming said metal-containing material, and then said metal-containing material is formed after patterning at least a part of said capping insulation film.

42. A method for manufacturing a polycrystalline silicon film to obtain a crystalline silicon film comprising the steps of:
 forming an amorphous silicon film on an insulation substrate;
 forming a capping insulation film on said amorphous silicon film;
 crystallizing the amorphous silicon film; and
 illuminating linear light radiated from at least a lamp, using a focusing unit, on the crystalline silicon film formed on the insulation substrate according to a scanning method.

43. The crystallization method according to claim 42, wherein said linear light is illuminated from the upper portion, the lower portion or both the upper and lower portions of the crystalline silicon film.

44. The crystallization method according to claim 42, wherein said linear light is simultaneously illuminated on at least one portion of the crystalline silicon film.

45. The crystallization method according to claim 42, wherein said capping insulation film is an oxide film or a nitride film.

46. A method for manufacturing a polycrystalline silicon thin-film to obtain a crystalline silicon film transistor comprising the steps of:
 forming an active layer composed of an amorphous silicon film on an insulation substrate;
 forming an amorphous silicon thin-film transistor by forming a gate insulation film and a gate electrode;
 forming at least one metal-containing material on at least a part of the amorphous silicon film;
 crystallizing the amorphous silicon film; and
 illuminating linear light radiated from at least a lamp on the crystalline silicon film formed on the insulation substrate according to a scanning method.

47. The method according to claim 46, wherein said step of forming the metal-containing material is performed by one of a deposition method, an ion implantation method, and a solution coating method.

48. The method according to claim 46, wherein said linear light is illuminated from the upper portion, the lower portion or both the upper portions of the crystalline silicon film.

49. The method according to claim 46, wherein said linear light is simultaneously illuminated on at least one portion of the crystalline silicon film.

50. The method according to claim 46, wherein said metal-containing material is comprised of one selected from a group composed of Ni, Fe, Co, Ru, Rh, Pd, Os, Ir, Pt, Sc, Ti, V, Cr, Mn, Cu, Zn, Au and Ag or an alloy thereof.

51. The method according to claim 46, wherein said amorphous silicon film is crystallized by MIC (metal-induced crystallization).

52. The method according to claim 46, wherein said amorphous silicon film is crystallized by MILC (metal-induced lateral crystallization).

53. The method according to claim 46, further comprising the step of forming a capping insulation film on said amorphous silicon film.

54. The method according to claim 52, wherein said capping insulation film is an oxide film or a nitride film.

55. The method according to claim 52, wherein said capping insulation film is formed after forming said metal-containing material.

56. The method according to claim 52, wherein said capping insulation film is formed prior to forming said metal-containing material, and then said metal-containing material is formed after patterning at least a part of said capping insulation film.

57. A method for manufacturing a polycrystalline silicon thin-film transistor comprising the steps of:
 forming an active layer composed of an amorphous silicon film on an insulation substrate;
 forming an amorphous silicon thin-film transistor by forming a gate insulation film and a gate electrode on the active layer;
 crystallizing the amorphous silicon film to obtain a crystalline silicon film;
 forming a capping insulation film on said crystalline silicon film; and
 illuminating linear light radiated from at least a lamp on the crystalline silicon film formed on the insulation substrate according to a scanning method.

58. The method according to claim 57, wherein said linear light is illuminated from the upper portion, the lower portion or both the upper and lower portions of the crystalline silicon film.

59. The method according to claim 57, wherein said linear light is simultaneously illuminated on at least one portion of the crystalline silicon film.

60. The method according to claim 57, wherein said capping insulation film is an oxide film or a nitride film.

61. A method for manufacturing a polycrystalline silicon thin-film transistor comprising the steps of:
 forming an active layer composed of an amorphous silicon film on an insulation substrate;
 forming an amorphous silicon thin-film transistor by forming a gate insulation film and a gate electrode;
 forming at least one metal-containing material on at least a part of the amorphous silicon film;
 crystallizing the amorphous silicon film to obtain a crystalline silicon film;
 doping impurities on at least a part of the active layer; and
 illuminating linear light radiated from at least a lamp on the crystalline silicon film formed on the insulation substrate according to a scanning method.

62. The method according to claim 61, wherein said step of forming the metal-containing material is performed by one of a deposition method, an ion implantation method, and a solution coating method.

63. The method according to claim 61, wherein said linear light is illuminated from the upper portion, the lower portion or both the upper and lower portions of the crystalline silicon film.

64. The method according to claim 61, wherein said linear light is simultaneously illuminated on at least one portion of the crystalline silicon film.

65. The method according to claim 61, wherein said metal-containing material is comprised of one selected from a group composed of Ni, Fe, Co, Ru, Rh, Pd, Os, Ir, Pt, Sc, Ti, V, Cr, Mn, Cu, Zn, Au and Ag or an alloy thereof.

66. The method according to claim 61, wherein said amorphous film is crystallized by MIC (metal-induced crystallization).

67. The method according claim 61, wherein said amorphous silicon film is crystallized by MILC (metal-induced lateral crystallization).

68. The method according to claim 61, further comprising the step of forming a capping insulation film on said amorphous film.

69. The method according to claim 68, wherein said capping insulation film is an oxide film or a nitride film.

70. A method for manufacturing a polycrystalline silicon thin-film transistor comprising the steps of:

forming an active layer composed of an amorphous silicon film o an insulation substrate;

forming an amorphous silicon thin-film transistor by forming a gate insulation film and a gate electrode on the active layer;

crystallizing the amorphous silicon film to obtain a crystalline silicon film;

doping impurities on at least a part of the active layer;

forming a capping insulation film on the crystalline silicon film; and illuminating linear light radiated from at least a lamp on the crystalline silicon film formed on the insulation substrate according to a scanning method.

71. The method according to claim 70, wherein said linear light is illuminated from the upper portion, the lower portion or both the upper an lower portions of the crystalline silicon film.

72. The method according to claim 70, wherein said linear light is simultaneously illuminated on at least one portion of the crystalline silicon film.

73. The method according to claim 70, wherein said capping insulation film is an oxide film or a nitride film.

* * * * *